United States Patent
Klaren

(10) Patent No.: US 10,141,907 B1
(45) Date of Patent: Nov. 27, 2018

(54) INTEGRATED BPF AND LNA INPUT MATCH

(71) Applicant: pSemi Corporation, San Diego, CA (US)

(72) Inventor: Jonathan James Klaren, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/686,773

(22) Filed: Aug. 25, 2017

(51) Int. Cl.
*H03H 7/01* (2006.01)
*H03H 9/00* (2006.01)

(52) U.S. Cl.
CPC ............ *H03H 7/01* (2013.01); *H03H 9/0014* (2013.01); *H03F 2200/165* (2013.01); *H03F 2200/222* (2013.01); *H03F 2200/294* (2013.01); *H03F 2200/451* (2013.01); *H03H 7/175* (2013.01); *H03H 7/1758* (2013.01); *H03H 7/1766* (2013.01); *H03H 7/1775* (2013.01)

(58) Field of Classification Search
CPC .... H03H 9/0014; H03H 7/175; H03H 7/1758; H03H 7/1766; H03H 7/1775; H03F 2200/222; H03F 2200/237; H03F 2200/241
See application file for complete search history.

(56) References Cited

U.S. PATENT DOCUMENTS

| | | | | |
|---|---|---|---|---|
| 8,902,020 B2 * | 12/2014 | Bradley | ................ | H03H 9/725 333/133 |
| 2001/0052831 A1 * | 12/2001 | Milsom | .................. | H03H 9/564 333/189 |
| 2002/0100422 A1 * | 8/2002 | Hilliker | ............. | H01J 37/32082 |
| 2003/0224746 A1 * | 12/2003 | Contopanagos | ......... | H03H 7/03 455/194.2 |
| 2007/0290767 A1 * | 12/2007 | Ali-Ahmad | .............. | H03H 9/54 333/133 |
| 2007/0290769 A1 * | 12/2007 | Stuebing | .............. | H03H 9/0014 333/189 |
| 2008/0079497 A1 * | 4/2008 | Fang | ....................... | H03F 1/223 330/302 |
| 2008/0125074 A1 * | 5/2008 | Hallivuori | ................ | H04B 1/18 455/334 |
| 2008/0252397 A1 * | 10/2008 | Stuebing | ................ | H03H 9/542 333/189 |
| 2009/0170456 A1 * | 7/2009 | Kuo | ..................... | H04B 1/0053 455/150.1 |
| 2010/0073106 A1 * | 3/2010 | Stuebing | ................ | H03H 9/542 333/187 |
| 2015/0070058 A1 * | 3/2015 | Rada | ........................ | H03F 3/193 327/156 |
| 2015/0222246 A1 * | 8/2015 | Nosaka | ................ | H03H 9/6483 333/187 |

* cited by examiner

*Primary Examiner* — Duc M Nguyen
(74) *Attorney, Agent, or Firm* — Jaquez Land Greenhaus LLP; Martin J. Jaquez, Esq.; Alessandro Steinfl, Esq.

(57) ABSTRACT

Radio frequency (RF) receiver design is a challenging task, involving conflicting requirements such as tight link budget, small footprint, low insertion loss, tuning and out-of-band rejections. Methods and devices are described to allow RF receiver design meeting stringent requirements at higher frequencies while preserving a small footprint and without affecting the overall performance.

9 Claims, 14 Drawing Sheets

600A

| | switch S1 | BPF | switch S2 | LNA | switch S3 | Units, dB |
|---|---|---|---|---|---|---|
| Gain | -0.2 | -1.6 | -0.2 | 20.7 | -0.2 | dB |
| NF | 0.2 | 1.6 | 0.2 | 1.4 | 0.2 | dB |
| cummulative Gain | -0.2 | -1.8 | -2 | 18.7 | 18.5 | dB |
| cummulative NF | 0.2 | 1.8 | 2 | 3.4 | 3.6 | dB |

INTEGRATED BPF AND LNA INPUT MATCH

BACKGROUND

(1) Technical Field

The present disclosure is related to radio frequency (RF) receiver design, and more particularly to methods and apparatus for designing RF elements providing both filtering and impedance matching functionalities at the same time.

(2) Background

RF filters form an important element within a variety of RF circuits, enabling the in-band required frequencies to be passed through the circuit, while rejecting those out-of-band frequencies that are not needed. It is known that design of RF filters, especially in higher frequencies, is a challenging task due to conflicting requirements such as low insertion loss (IL) and high out-of-band rejection.

FIG. 1A shows a typical RF receiver 100 comprising a bandpass filter (BPF) 12, a low noise amplifier (LNA) 13, an antenna 11 and three switches (e.g., S1, S2 and S3). In order to highlight design challenges, it is assumed that the RF receiver 100 is designed to operate in Long Term Evolution (LTE) frequency band 42 (3.4 GHz to 3.6 GHz). Receiver design requirements associated with this band are stringent and some relevant examples are as follows:

High gain, 18.5 dB end to end (from point A to point B as shown in FIG. 1A
  Low noise figure (less than 4 dB)
  Rejection of −42 dB at 2.4 GHZ and −42 dB at 5.5 GHz
  Small receiver circuit size The strict out-of-band rejection requirements for this application are due to the fact that the antenna 11 is shared between band 42 and WiFi®. In order to preserve the receiver performance, high rejection of WiFi jammers is desired. Given that the antenna 11 is shared, the switch S1 is configured to use either the LNA 13 or the rest of the circuit sharing the antenna 11. The switches S2 and S3 are optional and are used to bypass the LNA 13 in cases where the received signal strength is high and therefore the LNA gain is no longer needed.

FIG. 1B shows a table 110 representing an end to end gain/NF budget (from point A to point B of FIG. 1A) for the receiver 100 of FIG. 1A. As can be noticed and given the dB allocations shown in the table 100, only 1.6 dB may be allocated to the IL of the BPF 12 of FIG. 1A. The person skilled in the art will understand that achieving such IL and stringent rejection ratios as mentioned above for band 42 is a challenging task.

To further illustrate the design tradeoffs, a simulated frequency response of a design of the BPF 12 of FIG. 1A is shown in FIG. 2. This design represents an attempt to meet the stringent requirements mentioned above. The two frequency nulls m1 and m2 as shown in the frequency response are carefully spaced to meet the out-of-band rejection requirement and at the same time, maintain the in-band tuning performance of the filter. It is noted that a small shift in any of those two nulls would have an adverse effect on a filter skirt slope 201 and thus impacting the in-band tuning. In a similar manner, a misplacement of the other two frequency nulls m12 and m14 would result in a jump of an in-between bump 202 over the stringent −42 dB out-of-band rejection. Furthermore, achieving a low IL of 1.6 dB in-band is another challenge given the out-of-band rejection requirements.

FIG. 3 shows a BPF 300 designed to meet the above mentioned requirements. The BPF 300 is made of 4 shunt resonators (301-304) and a series resonator 305. Each of the resonators comprises a series arrangement of a capacitor and an inductor. The shunt resonators (301, 302) and (303, 304) are designed in pair to reject lower and higher out-of-band frequency ranges. In other words and in order to meet the pass band requirements as mentioned above, the shunt resonators 301 and 303 are designed to be in low impedance (short) for a frequency range around 2 GHz and the shunt resonators 302 and 304 are designed to be in low impedance (short) for a frequency range around 5 GHz. The series resonator 305 is designed to show a low impedance (short) for in-band frequencies corresponding to band 42. In view of above and at in-band frequencies, the shunt resonator 301 will be an inductive impedance and the shunt resonator 302 will be a capacitive impedance. The resonators 301 and 302 are designed such that a combination these residual respective inductive and capacitive impedances will show a high impedance (open) at in-band frequencies. The same applies to the paired shunt resonators 303 and 304. As a result of such design and at in-band frequencies, the impact of impedances of the paired resonators (301, 302) and (303, 304) on the overall in-band frequency response of the BPF 300 is minimized. This is also demonstrated by a smith chart 400 of FIG. 4. The smith chart 400 represents a parallel combination of the resonators (301, 302). A similar chart may be obtained for a parallel combination of the resonators (303, 304). Referring to FIG. 4 and sweeping frequencies from around 2 GHz to 5 GHz, points m2, m1 and m3 correspond to lower out-of-band, in-band and higher out-of-band frequencies respectively. More in particular, note the points m2 and m3 showing low impedances at out-of-band frequencies 2.450 GHz and 5.750 GHz respectively and the point m1 showing high impedance for the in-band frequency 3.550 GHz.

FIG. 5 shows a receiver 500 comprising the BPF 300 of FIG. 3, a series resonator 510 and an LNA 515. The series resonator 510 is used for impedance matching purpose. Switches S4 and S5 are optional and may be used to bypass the LNA 525 in cases where a received signal is strong enough and there is no need for the LNA gain. With reference to FIGS. 1A-1B, using a combination the BPF 300 of FIG. 3 and the series resonator 510 at the LNA 525 front end will make the task of meeting the link budget and filtering requirements even more challenging than what was described previously. Addition of the series resonator 510 will add to the IL of the receiver front end implying a higher gain requirement and at the same time, such addition has negative impact on the overall NF. Additionally, implementing such design of receiver front end will require 6 capacitors and more in particular 6 inductors requiring a large space given the typical size of inductors. Generally speaking, using a high number of elements in RF design will also have adverse effects such as an increase of off-chip parasitics. It is well known that off-chip parasitics have negative impact on gain and NF and this will make the task of RF receiver design, especially at higher frequencies, very challenging.

SUMMARY

Reiterating what was described above, design of RF front ends, especially at higher frequencies, is challenging due to stringent and usually conflicting requirements such as tight link budget, small foot print, low NF, low BPF in-band IL, stringent BPF in-band tuning and out-of-band rejection.

Methods and devices taught in the present disclosure provide solutions to this problem.

According to a first aspect of the present disclosure, a combined filter and impedance match block is provided, comprising: a first shunt element; a second shunt element, and a series element connected with the first shunt element and the second shunt element; wherein: the first shunt element and the second shunt element are configured to reject set out-of-band frequencies, and the series element is configured i) to pass set in-band frequencies and ii) as an impedance matching element, to match a first impedance to a second impedance.

According to a second aspect of the present disclosure, a method of filtering and impedance matching is disclosed, providing: providing a filter and match block, the filter and match block comprising a series element, a first shunt element and a second shunt element; configuring the first shunt element and the second shunt element to reject set out-of-band frequencies; configuring the series element i) to pass set in-band frequencies and ii) as an impedance matching element to match a fifth impedance to a sixth impedance; and configuring the first shunt element and the second shunt element to be open circuits at the set in-band frequencies.

DESCRIPTION OF THE DRAWINGS

FIG. 1B shows an exemplary loss/gain budget related to the receiver module of FIG. 1A.

DETAILED DESCRIPTION

The term "in-band frequencies" is referred herewith to set frequencies enabled by a filter to be passed through a circuit and the term "out-of-band frequencies" is referred herewith to set frequencies that are rejected by said filter. The term "filtering mask" is defined herewith as a mask representing a combination of the in-band frequencies and the out-of-band frequencies corresponding to a filter. Throughout the disclosure, embodiments representing band-pass filters are described wherein said band-pass filters comprise shunt and series resonators. Within this context, the terms "high impedance", "open" and "open circuit" are used interchangeably to refer to cases where said shunt resonators have high enough impedance values (open circuit) with minimal impact on a signal passing through said band-pass filters.

Generally speaking, RF receivers comprise multiple RF blocks designed to fulfill different functionalities. Two of the main required functionalities are filtering and impedance matching. It is highly desired to reduce the number of RF blocks when designing RF receivers to overcome some of the design challenges as described in the previous section. In accordance with an embodiment of the present disclosure, one way to achieve this is to design one or more elements belonging to a given RF block such that the one or more elements contribute in functionalities provided by one or more other RF blocks. By way of example and not of limitation, one or more elements of a receiving filter of an RF receiver may be designed to contribute concurrently in both filtering and impedance matching functions as required by the RF receiver. As a result of such design approach, the overall number of elements involved in design is reduced, resulting in a better overall receiver performance as described earlier.

Figure 6A:
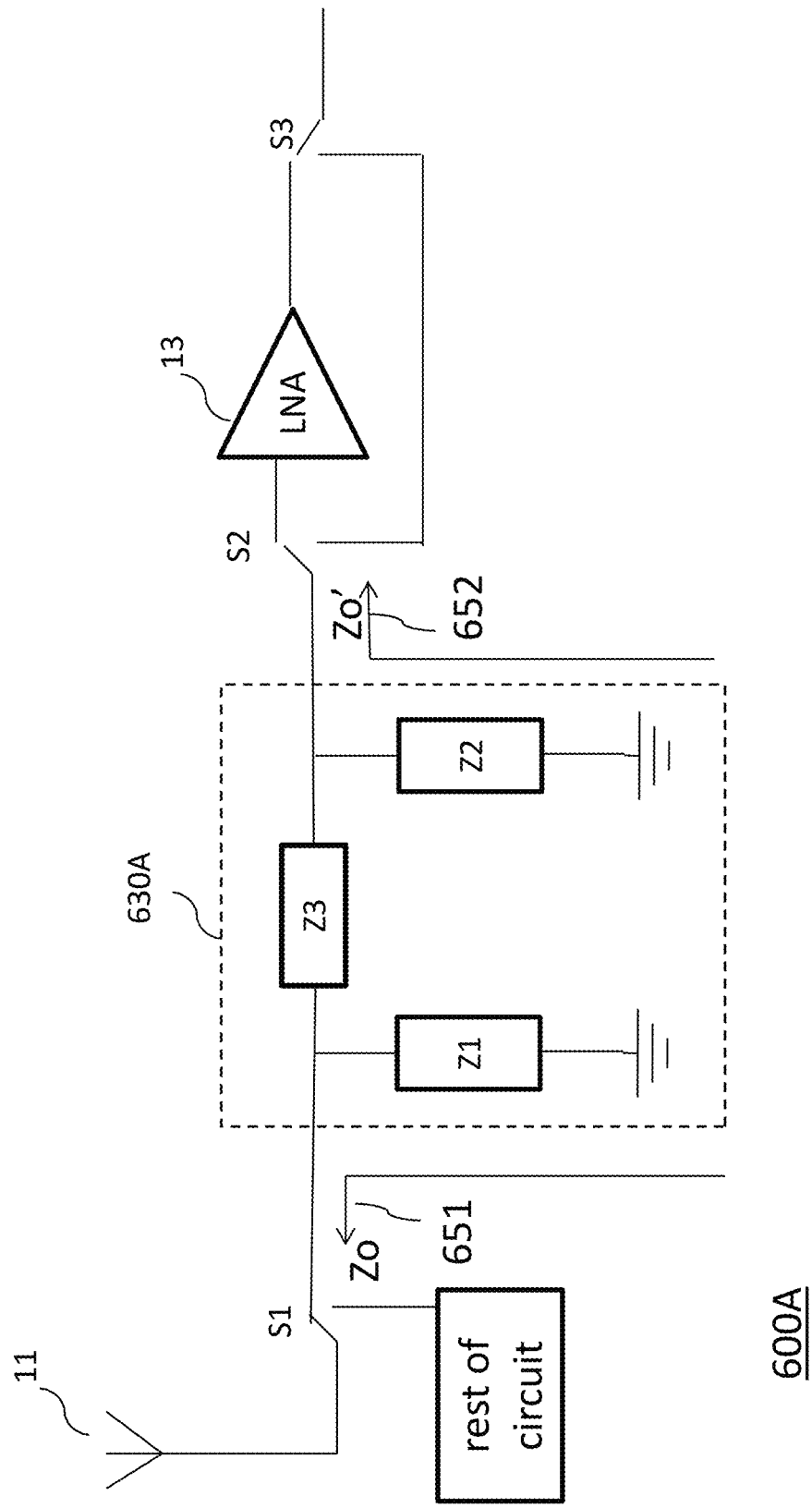
FIG. 6A shows an RF receiver according to an embodiment of the disclosure.

FIG. 6A, shows an RF receiver 600A in accordance with an embodiment of the present disclosure. The receiver 600A comprises a combined filter and impedance match block 630A. The combined filter and impedance match block 630A comprises two shunt elements Z1 and Z2 and a series element Z3. The shunt elements Z1 and Z2 are designed to be each a low impedance (short) at out-of-band frequencies and to be each a high impedance (open) at in-band frequencies. Therefore, the shunt elements Z1 and Z2 bypass out-of-band frequencies and have minimal impact on in-band frequencies. The series element Z3 is designed to provide the in-band impedance transformation for optimal RF matching. In other words, the series element Z3 is designed to match impedances Zo and Zo' as shown by arrows 651 and 652 respectively, wherein the impedance Zo is an output impedance of a driving circuit (in this case the antenna), the driving circuit feeding combined filter and impedance match block 630A and the impedance Zo' is the impedance of the LNA 13 input. The person skilled in the art will appreciate that by virtue of such design approach, the need for an extra RF element required for LNA input impedance matching is eliminated thus reducing the total number of receiver elements. The person skilled in art will also understand that without departing from the spirit and scope of the disclosure, the combined filter and impedance match block 630A may be designed to be a low-pass filter, a high-pass filter, a BPF or any other type of filter meeting desired requirements. Referring to FIG. 6A, the shunt elements Z1 and Z2 may comprise each, a set of parallel resonators according to an embodiment of the disclosure. In other embodiments in accordance to the present disclosure, said parallel resonators comprise each a series configuration of an inductor and a capacitor. Throughout the rest of the disclosure, exemplary embodiments wherein the combined filter and impedance match block 630A is designed as a BPF and matching element are described in more detail.

Figure 5:
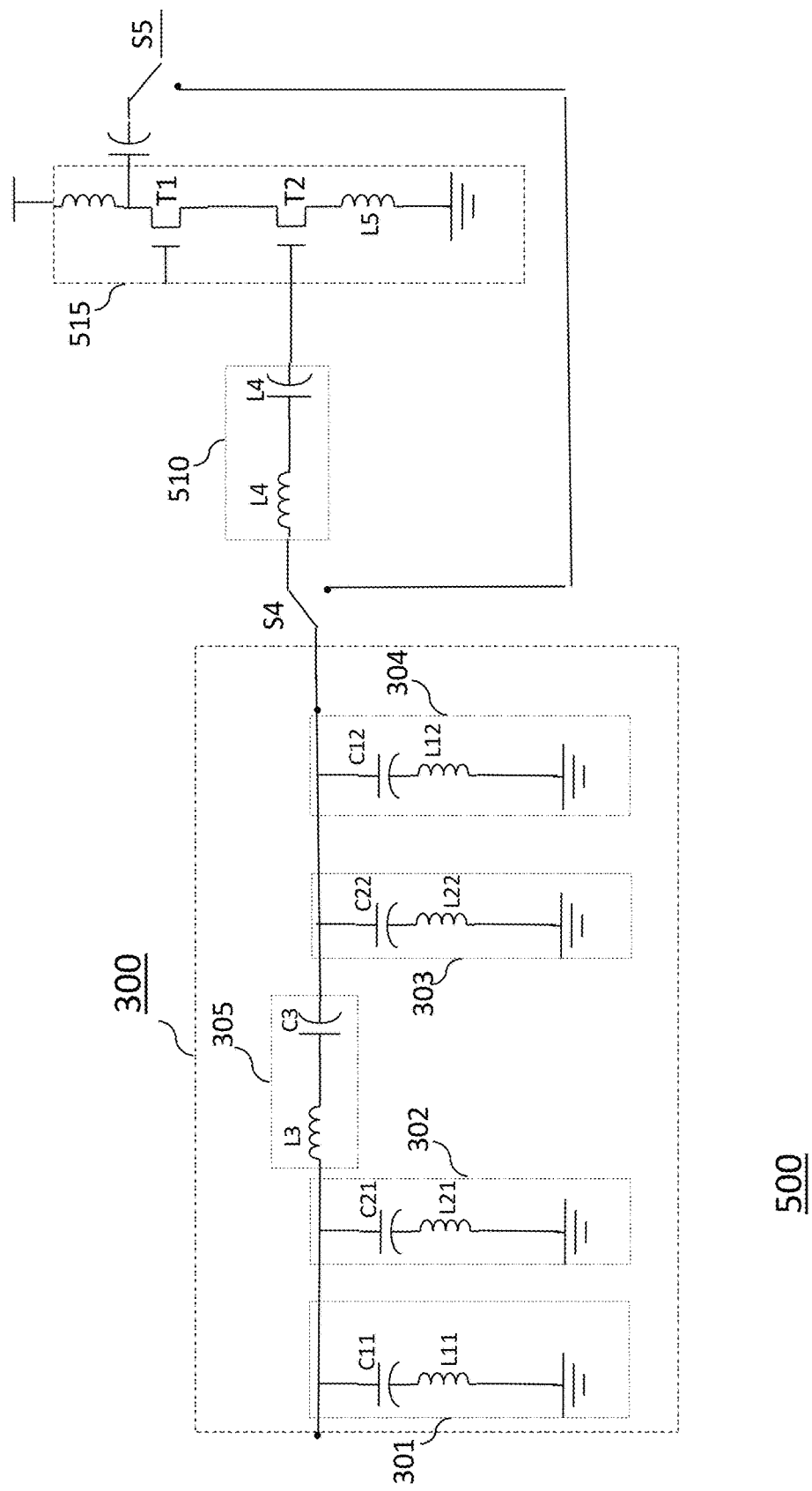
FIG. 5 shows an RF receiver.
Figure 6B:
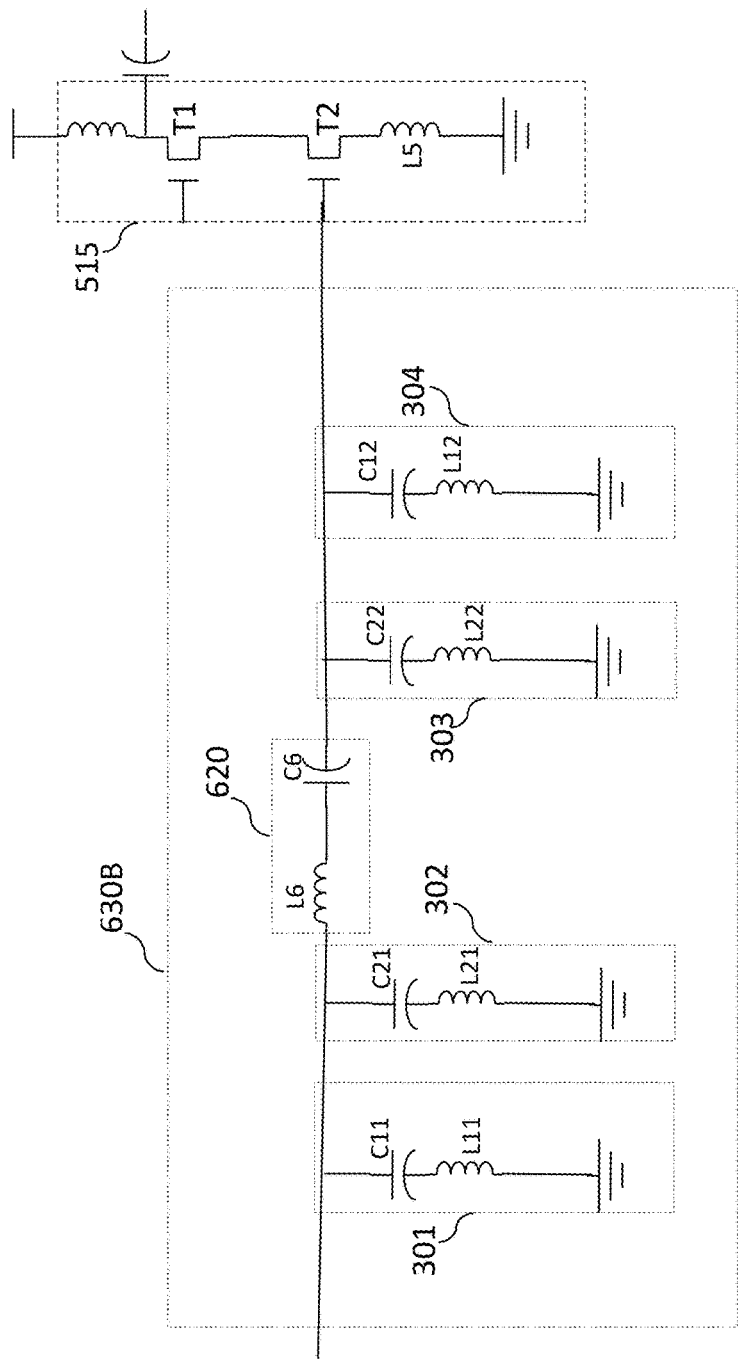
FIG. 6B shows an RF receiver according to another embodiment of the disclosure.

Referring back to the receiver 500 of FIG. 5, the resonators 305 and 510 are used for filtering and impedance matching purposes. As described previously and from an overall RF receiver performance standpoint, it is highly desired to reduce the number of elements used in the design of such receivers. FIG. 6B shows an RF receiver 600B in accordance with an embodiment of the disclosure. The RF receiver 600B comprises a combined filter and impedance match block 630B, the combined filter and impedance match block 630B comprising a series resonator 620. The series resonator 620 is designed to contribute in band-pass filtering and also to match the LNA input impedance at in-band frequencies. The principle of operation of the receiver 600 is similar to what was explained with reference to the receiver 500 of FIG. 5 except that the resonator 620 provides both filtering and impedance matching functionalities at the same time. In other words, the resonator 620 is designed to replace both the resonators 305 and 510 of the receiver 500 of FIG. 5. The benefits of such design is a reduced foot print and an overall improved insertion loss and NF as well by virtue of a design that involves a smaller number of elements.

Figure 7:
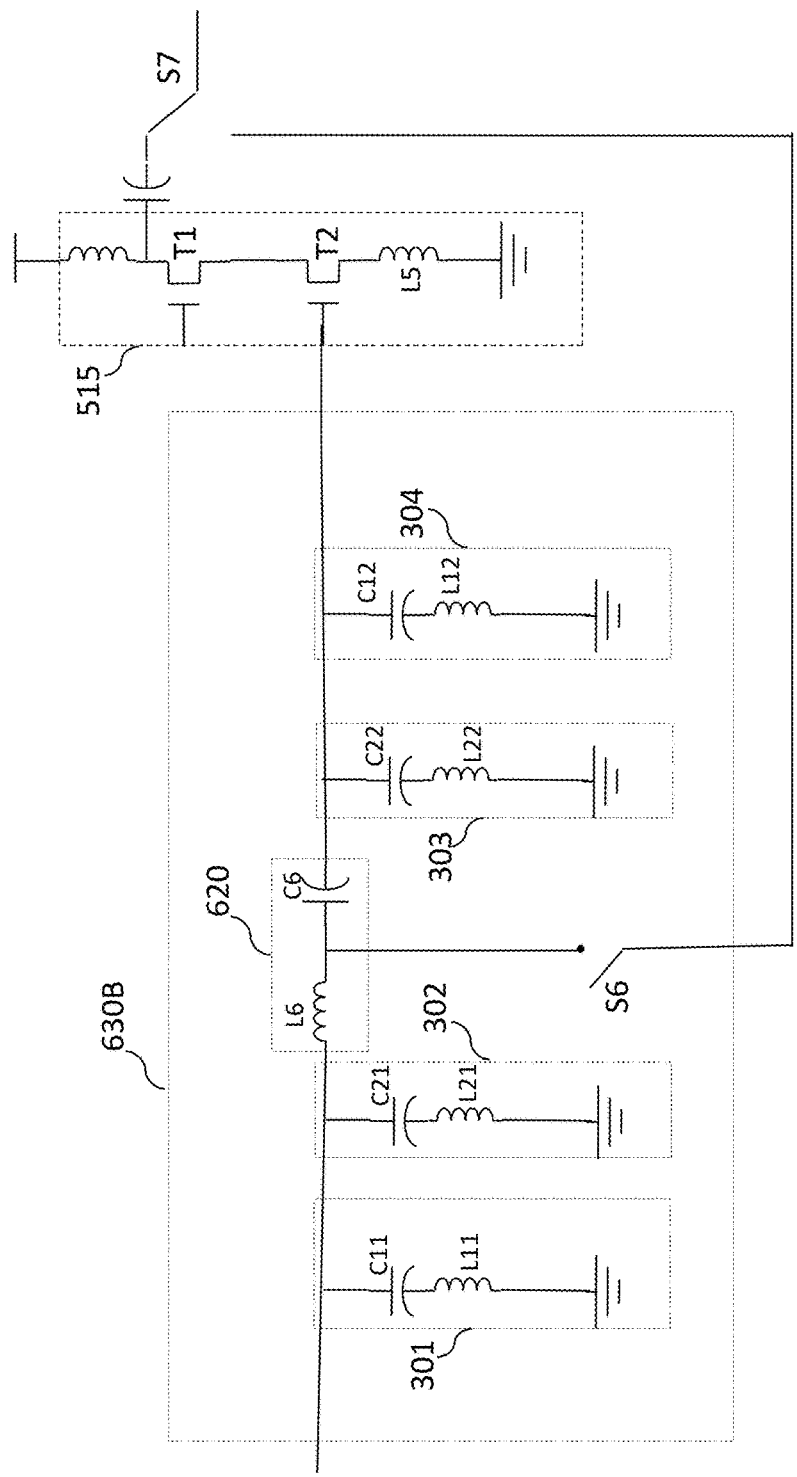
FIG. 7 shows the RF receiver of FIG. 6B further comprising additional switches.

FIG. 7 shows a receiver 700 according to an embodiment of the present disclosure. The principle of operation of the receiver 700 is similar to what was described with reference to receiver 600B of FIG. 6B. The receiver 700 comprises switches S6 and S7 which may be used to bypass the LNA 505 in cases where signal strength is high enough and there is no need for LNA gain.

Figure 8:
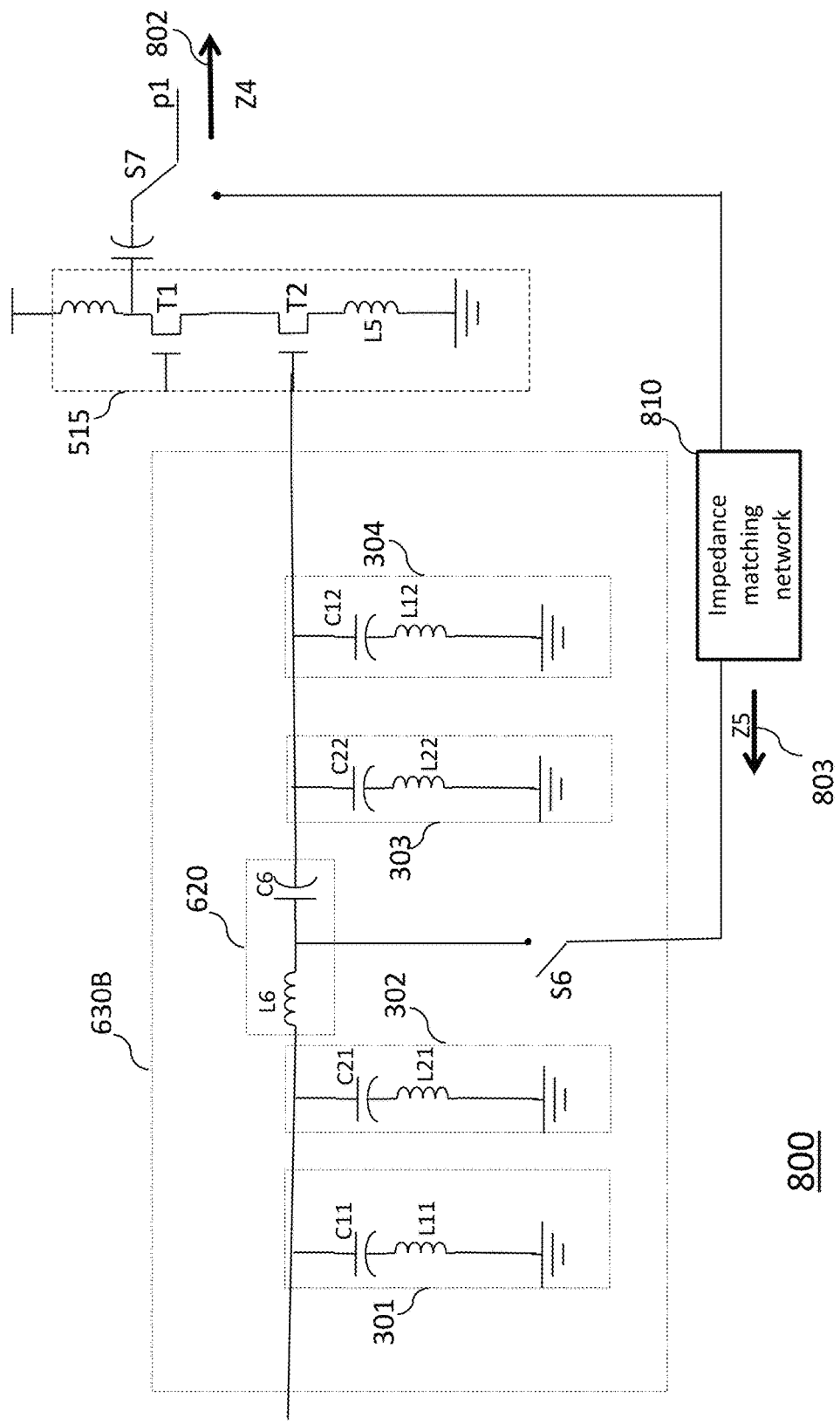
FIG. 8 shows the RF receiver of FIG. 7 further comprising an impedance matching network.

Referring back to FIG. 7, when bypassing the LNA 515 using the switches S6 and S7, as input signal is redirected through a different path, additional impedance matching may be needed. FIG. 8 shows a receiver 800 according to a further embodiment of the present disclosure. The receiver 800 is the receiver 700 of FIG. 7 further comprising an impedance matching network 810. According to an embodiment of the disclosure, the impedance matching network 810 matches an impedance Z4 as seen in a direction indicated by an arrow 802 at point p1 (e.g. impedance seen by the impedance matching network at an output of the impedance matching network) to an impedance Z5 as seen by the impedance matching network 810 in a direction indicated by an arrow 803 at an input of the impedance matching network.

Figure 1A:
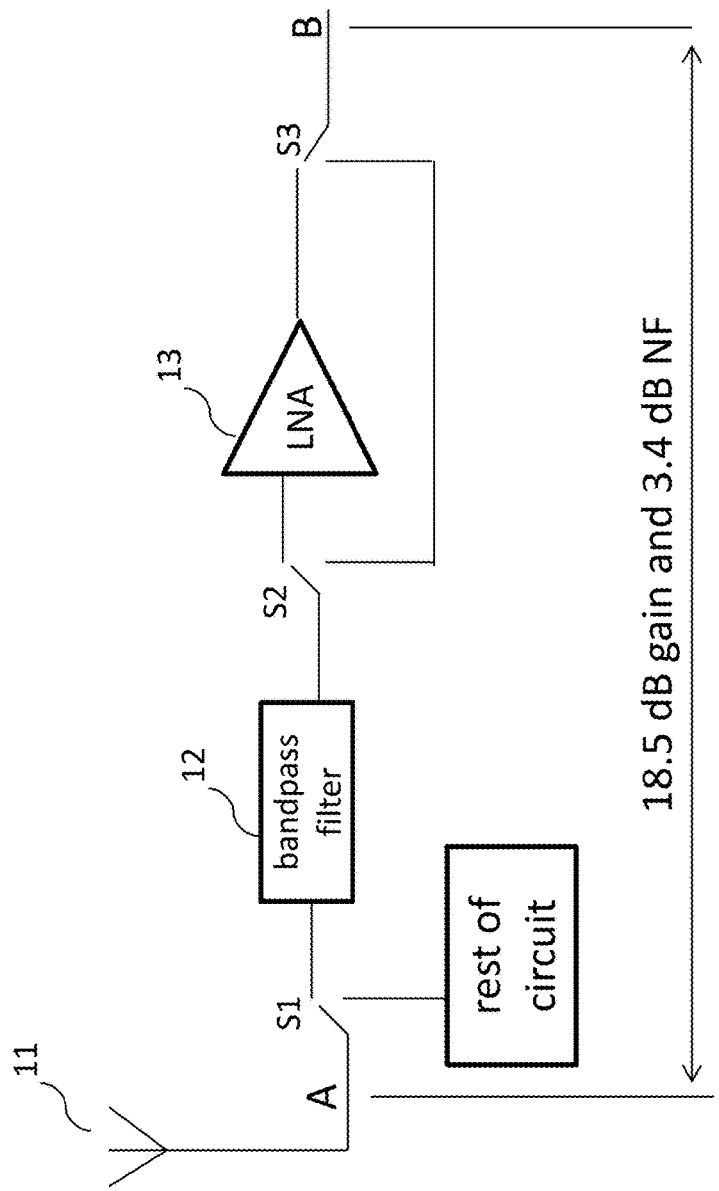
FIG. 1A shows a receiver module.
Figure 2:
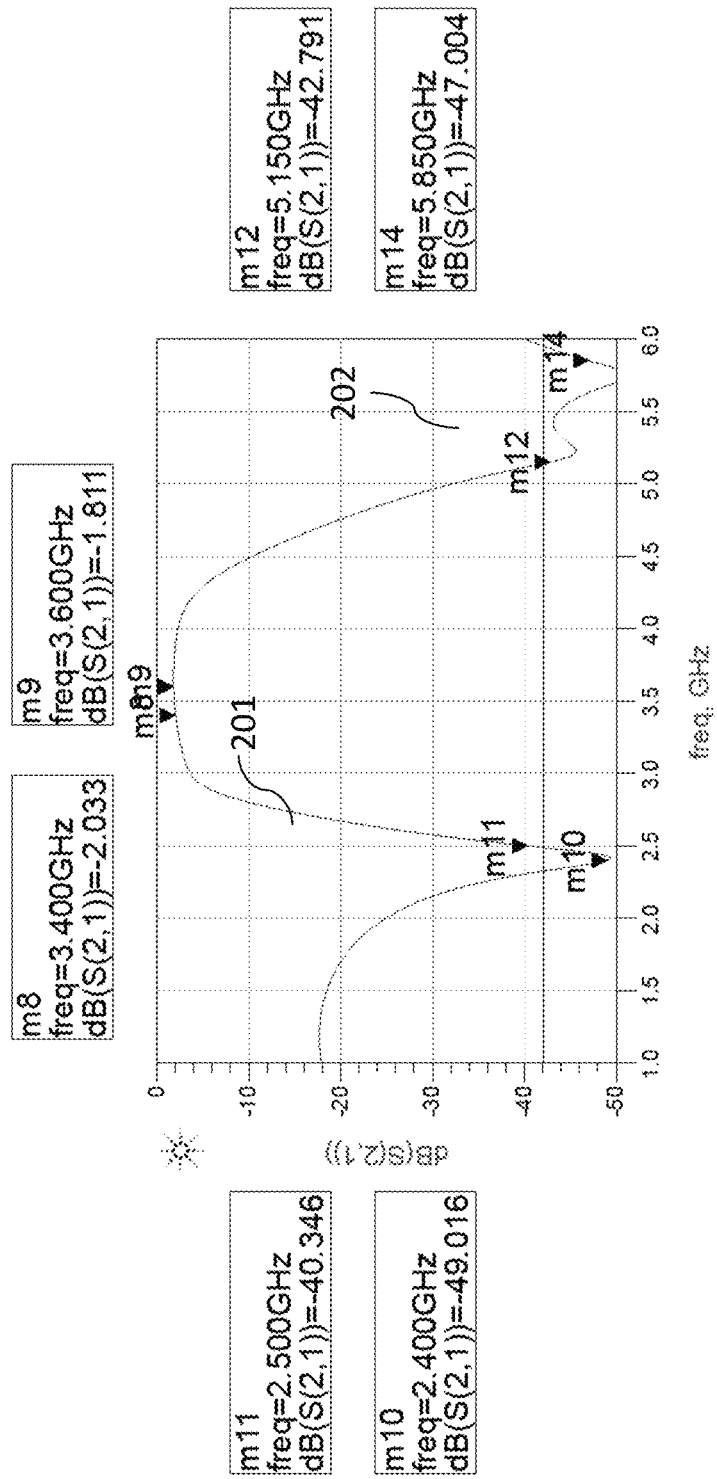
FIG. 2 shows frequency response of a BPF.
Figure 3:
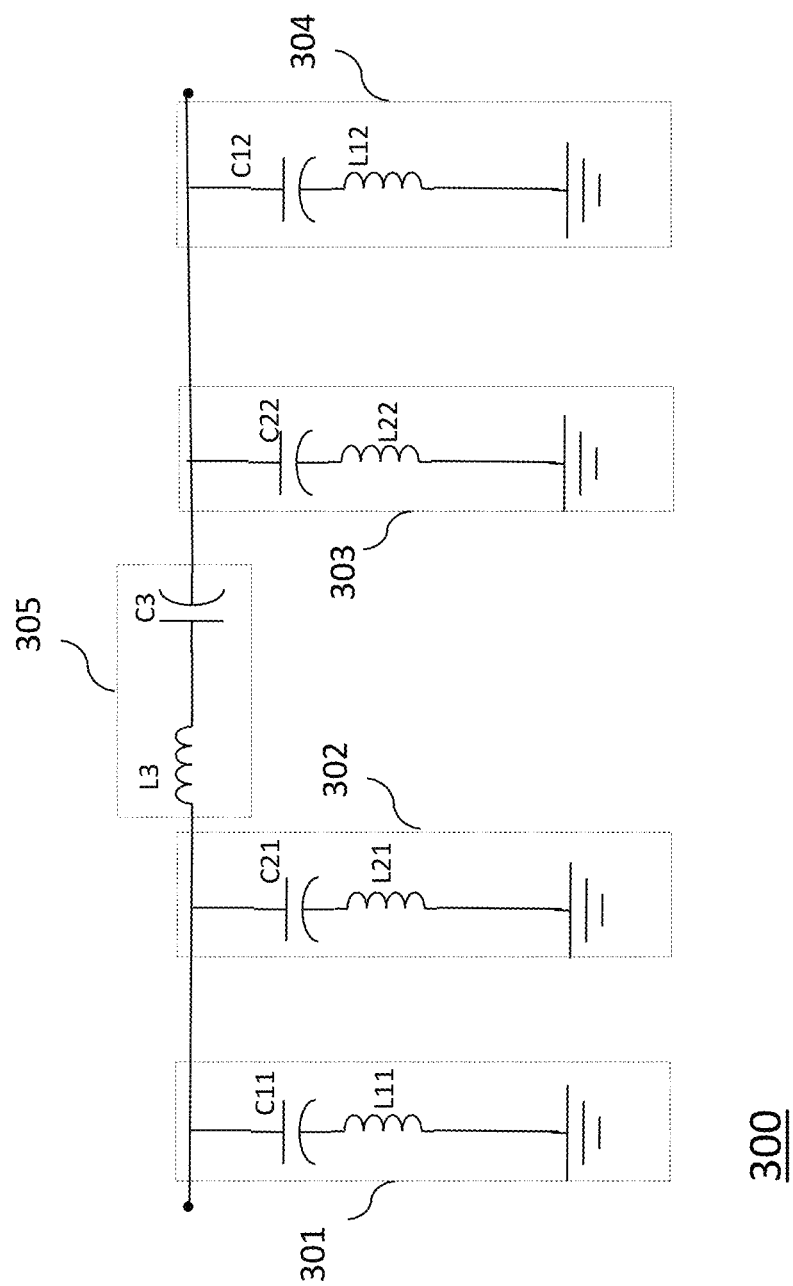
FIG. 3 shows a BPF.
Figure 4:
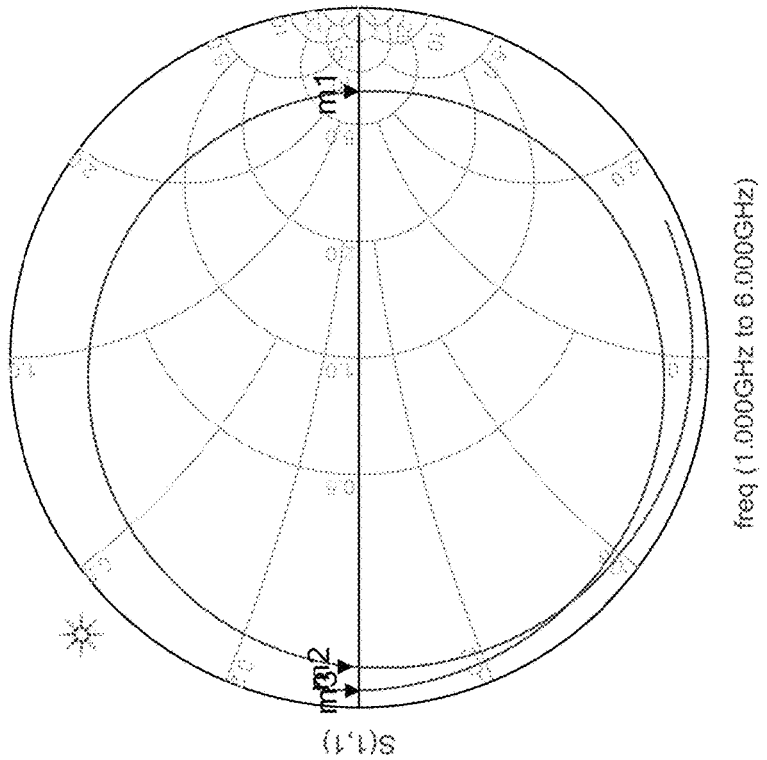
FIG. 4 shows a Smith chart corresponding to parallel shunt resonators.
Figure 9A:
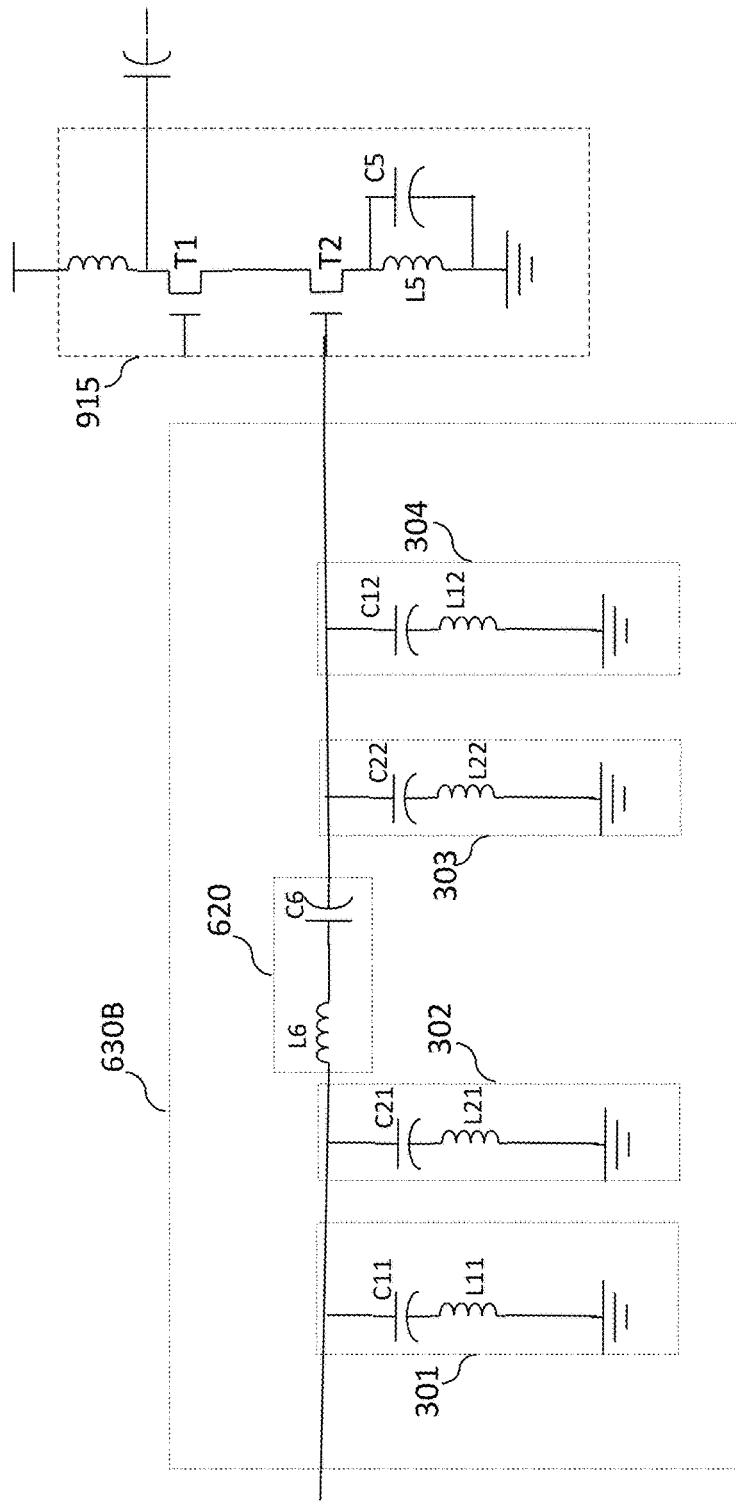
FIG. 9A shows the RF receiver of FIG. 6B further comprising a parallel capacitor coupled across a degenerative inductor to provide further out-of-band rejection.

With further reference to FIG. 2, FIG. 6B and the band 42 rejection requirements, as the resonator 620 is designed to match an input impedance of the LNA 515, an inductor L6 may be designed with a smaller inductance value than what is desired to meet in-band requirements dictated by band 42 and as a result, the out-of-band rejection of frequencies around 5 GHz may not be sufficient to meet the band 42 rejection requirements. A solution to overcome this issue due to conflicting requirements is provided by an embodiment in accordance with the present disclosure and as shown in FIG. 9A. A receiver 900A of FIG. 9A is the receiver 600B of FIG. 6B further comprising a capacitor C5 coupled across a degenerative inductor L5. A combination of the capacitor C5 and the degenerative inductor L5 are designed to resonate and therefore to go high impedance at 5 GHz, thereby further improving the 5 GHz rejection requirements of band 42.

Figure 9B:
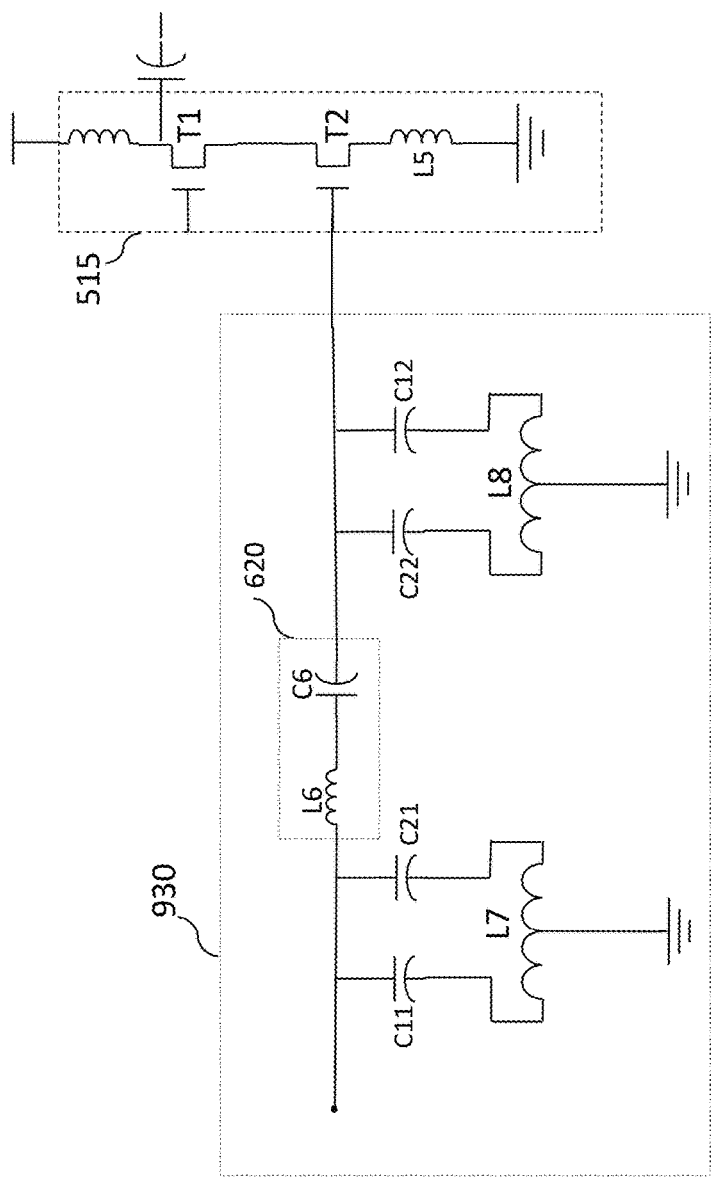
FIG. 9B shows an RF receiver comprising single inductors with tapped ground connection in accordance with a further embodiment of the disclosure.

Referring back to FIG. 6B, the combined filter and impedance match block 630B comprises 5 inductors. For a smaller design footprint, it is desired to reduce the number of inductors. According to teachings of the disclosure, one way to achieve this is to combine, for example, the inductors L11 and L21 into one single inductor with tapped ground connection. Same may be applied to the inductors L22 and L12. FIG. 9B shows a receiver 900B in accordance with a further embodiment of the present disclosure. The receiver 900B comprises a combined filter and impedance match block 930, the combined filter and impedance match block 930 comprising two inductors L7 and L8 with tapped ground connection. The principle of operation of the receiver 900B is similar to what was described previously related to the receiver 600B of FIG. 6. With further reference to FIG. 600B, the person skilled in the art will understand that for practical purpose, the inductors L11 and L21 are closely spaced in most designs. As such, there is mutual coupling between these two inductors when placed in proximity of each other and such coupling is always taken into account during design. Same applies to the inductors L22 and L12. The person skilled in the art will also understand that, when combining two inductors into one with tapped ground connection, such mutual coupling still exists and is taken into account the same way as described above during design. As a result, a use of inductors with tapped ground connection as taught in the present disclosure, has the benefit of saving space without having negative impact on overall performance.

Figure 9C:
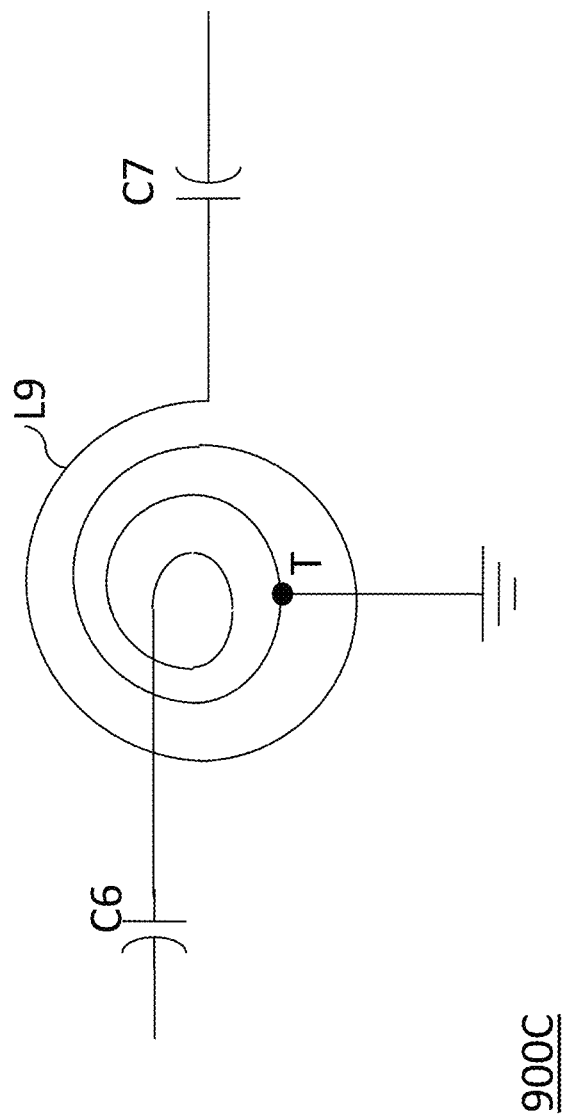
FIG. 9C shows a resonator according to an embodiment of the disclosure.

FIG. 9C shows an implementation of an inductor L9 according to an embodiment of the disclosure. The inductor L9 has a spiral shape and is tapped at a point T to ground. Capacitors C6 and C7 combined with the inductor L9 will result in two resonant circuits similar to the resonators 301 and 302 of FIG. 9A. A combination of tapping and spiral shape results in a smaller footprint associated with such implementation.

Figure 10:
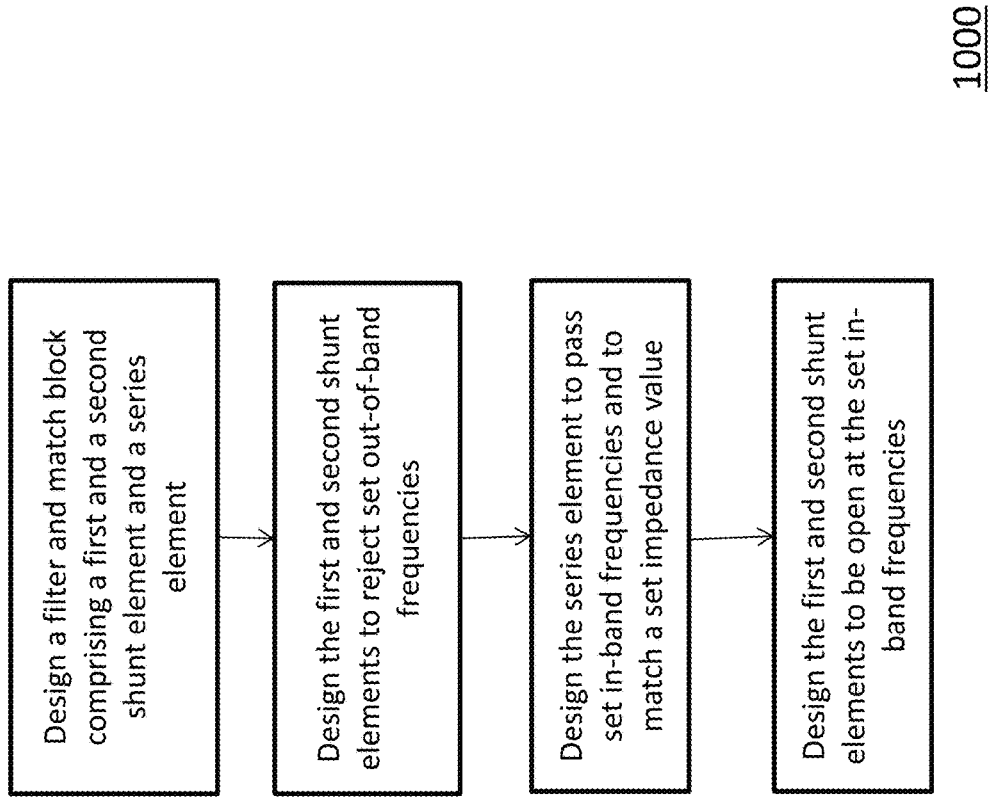
FIG. 10 shows a filter and impedance match block design flowchart in according with the teachings of the present disclosure.

FIG. 10 shows a flowchart 1000 representing a filter and impedance match block design in accordance with the teachings of the present disclosure. The flowchart 1000 comprises various steps describing a design based on two shunt elements and a series element. The series element is designed to pass set in-band frequencies and at the same time, to match a set impedance value. The shunt elements are designed to be low impedance to reject set out-of-band frequencies by shunting the RF signal to circuit ground, and to show open circuit at the set in-band-frequencies. According to an embodiment of the present disclosure, the filter and impedance match block may be designed to be used as part of a receiver comprising an LNA and wherein the set impedance value corresponds to an input impedance of the LNA.

The person skilled in the art will appreciate that without departing from the scope and spirit of the disclosure and from an implementation stand point, full integration or discrete implementation of embodiments are both possible. In other words, embodiments according to the present disclosure may be envisaged where all elements are implemented on a single die. This is in contrast with other embodiments in accordance with the present disclosure wherein an implementation based on using discrete elements may be applied. Embodiments according to the disclosure may also be made wherein some elements are integrated together on a single die and discrete implementation of other elements is applied.

What is claimed is:

1. An RF receiver comprising:
   a first shunt element;
   a second shunt element;
   a series element connected with the first shunt element and the second shunt element;
   an LNA comprising a transistor being connected to a degenerative inductor at a source of said transistor and to the second shunt element at a gate of said transistor; and
   a switch comprising a first end and a second end;
   wherein:
   the first shunt element and the second shunt element are configured to reject set out-of-band frequencies;
   the series element is configured i) to pass set in-band frequencies and ii) as an impedance matching element, to match a first impedance to a second impedance;

a combination of the set in-band frequencies and the set out-of-band frequencies corresponds to one of a i) band-pass filtering mask or ii) low-pass filtering mask or iii) high-pass filtering mask;
the series element comprises a series resonator;
when the switch is in a closed state, the LNA is bypassed;
the first end is connected with a point of connection within or at the input of the series resonator, and
the second end is connected with an output of the LNA.

2. The RF receiver of claim 1 implemented entirely on a single die.

3. An RF receiver comprising:
a first shunt element;
a second shunt element;
a series element connected with the first shunt element and the second shunt element; and
an LNA comprising a transistor being connected to a degenerative inductor at a source of said transistor and to the second shunt element at a gate of said transistor;
a switch and an impedance matching network wherein:
the first shunt element and the second shunt element are configured to reject set out-of-band frequencies;
the series element is configured i) to pass set in-band frequencies and ii) as an impedance matching element, to match a first impedance to a second impedance;
the series element comprises a series resonator;
when the switch is in a closed state, the impedance matching network is coupled across a point of connection of an inductor and a capacitor of the series resonator and an output of the RF receiver, and
when the switch is in an open state, the impedance matching network is detached from the RF receiver.

4. The RF receiver of claim 3, wherein the impedance matching network is configured to match a third impedance to a fourth impedance wherein:
the third impedance is an impedance seen by the impedance matching network at an input side of the impedance matching network; and
the fourth impedance is an impedance seen by the impedance matching network at an output side of the impedance matching network.

5. A combined filter and impedance match block comprising:
a first shunt element;
a second shunt element; and
a series element connected with the first shunt element and the second shunt element;
wherein:
the first shunt element and the second shunt element are configured to reject set out-of-band frequencies;
the series element is configured i) to pass set in-band frequencies and ii) as an impedance matching element, to match a first impedance to a second impedance; and
the first shunt element and the second shunt element are configured to be open circuits at the set in-band frequencies;
wherein:
(a) the first shunt element comprises:
a first single inductor with tapped ground connection, and
a first capacitor and a second capacitor;
(b) the second shunt element comprises:
a second single inductor with tapped ground connection, and
a third capacitor and a fourth capacitor;
(c) the series element comprises a series resonator.

6. The combined filter and impedance match block of claim 5, wherein a combination of the set in-band frequencies and the set out-of-band frequencies corresponds to a band-pass filtering mask.

7. An RF receiver comprising:
the combined filter and impedance match block of claim 6, and
a low noise amplifier (LNA) connected with the combined filter and impedance match block;
wherein:
the combined filter and impedance block of is configured to be fed by a driving circuit;
the first impedance corresponds to an output impedance of the driving circuit as seen by the combined filter and match block; and
the second impedance corresponds to an input impedance of the LNA.

8. The combined filter and impedance match block of claim 6, wherein each of the first single inductor and the second single inductor has a spiral shape.

9. The combined filter and impedance match block of claim 8 implemented entirely on a single die.

* * * * *